(12) United States Patent
Do et al.

(10) Patent No.: US 9,935,241 B2
(45) Date of Patent: Apr. 3, 2018

(54) SOLVENT FOR MANUFACTURE OF SELF-ASSEMBLED NANO-SCALE LED ELECTRODE ASSEMBLY AND METHOD FOR MANUFACTURING SELF-ASSEMBLED NANO-SCALE LED ELECTRODE ASSEMBLY BY THE SAME

(71) Applicant: PSI Co., Ltd., Yongin-si, Gyeonggi-do (KR)

(72) Inventors: Young Rag Do, Seoul (KR); Yeon Goog Sung, Gyeonggi-do (KR)

(73) Assignee: PSI CO., LTD., Gyeonggi-do (KR)

( * ) Notice: Subject to any disclaimer, the term of this patent is extended or adjusted under 35 U.S.C. 154(b) by 0 days.

(21) Appl. No.: 15/400,747

(22) Filed: Jan. 6, 2017

(65) Prior Publication Data
US 2017/0200859 A1    Jul. 13, 2017

(30) Foreign Application Priority Data
Jan. 7, 2016 (KR) ........................ 10-2016-0002270

(51) Int. Cl.
*H01L 33/36* (2010.01)
*H01L 33/20* (2010.01)
*H01L 25/075* (2006.01)
*H01L 27/15* (2006.01)
*H01L 33/00* (2010.01)

(52) U.S. Cl.
CPC .......... *H01L 33/36* (2013.01); *H01L 25/0753* (2013.01); *H01L 27/156* (2013.01); *H01L 33/005* (2013.01); *H01L 2924/12041* (2013.01)

(58) Field of Classification Search
CPC ............................ H01L 33/005; H01L 33/36
See application file for complete search history.

(56) References Cited

U.S. PATENT DOCUMENTS

2016/0148911 A1\* 5/2016 Do ...................... H01L 25/0753
                                                        257/88

FOREIGN PATENT DOCUMENTS

| JP | 2014-123583 A | 7/2014 | |
| KR | 10-2012-0122159 A | 11/2012 | |
| KR | 10-1429095 B1 | 8/2014 | |
| WO | WO 2015005655 A1 \* | 1/2015 | ......... H01L 25/0753 |

OTHER PUBLICATIONS

"Acetone." Wikipedia, The Free Encyclopedia. Wikipedia, The Free Encyclopedia, Jul. 17, 2017.\*
Shell Chemicals, Acetone: Technical Datasheet. Mar. 2016.\*

\* cited by examiner

*Primary Examiner* — Robert Bachner
*Assistant Examiner* — Molly Reida
(74) *Attorney, Agent, or Firm* — Masuvalley & Partners

(57) ABSTRACT

The present disclosure relates to a method for manufacturing a self-assembled nano-scale LED electrode assembly and more particularly, to a method for manufacturing a self-assembled nano-scale LED electrode assembly in which a nano-scale LED device can be self-aligned on two different electrodes without being chemically and physically damaged and the number of nano-scale LED devices to be mounted can be remarkably increased, and alignment and electrical connection of the LED devices can be further improved.

8 Claims, 10 Drawing Sheets

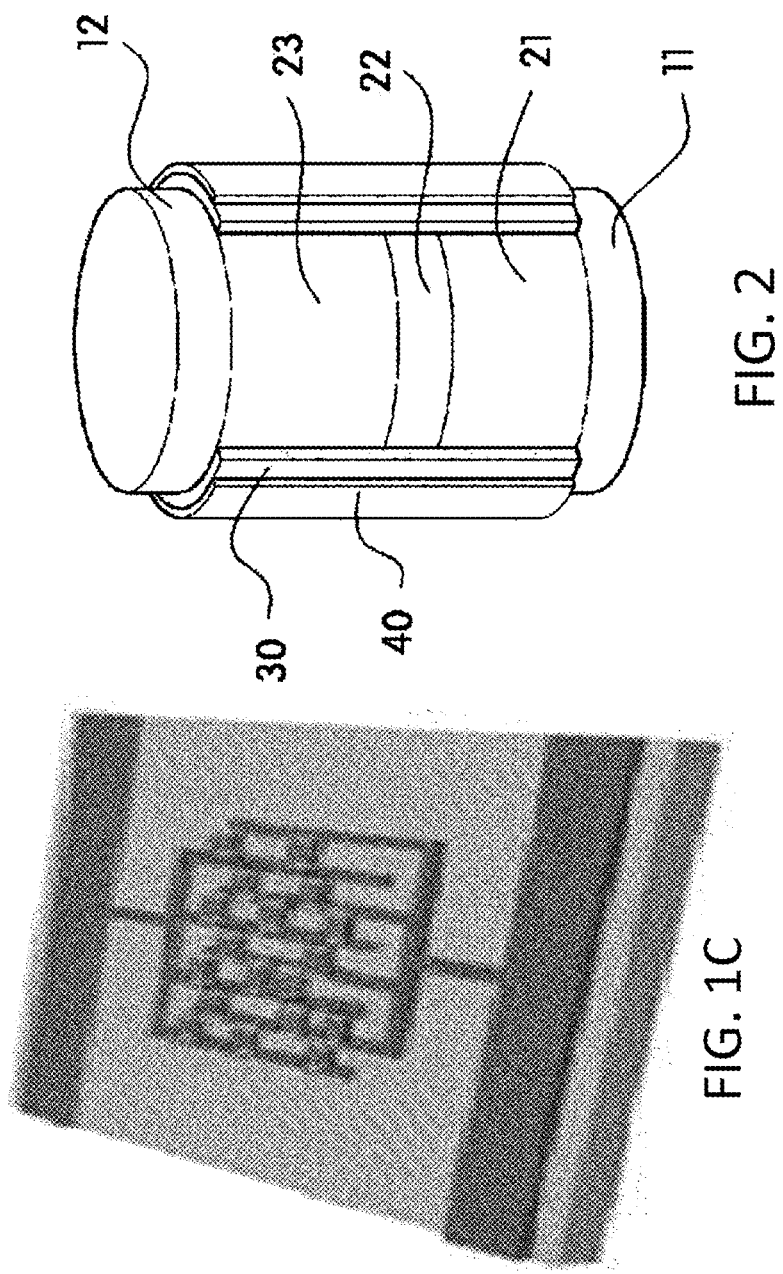

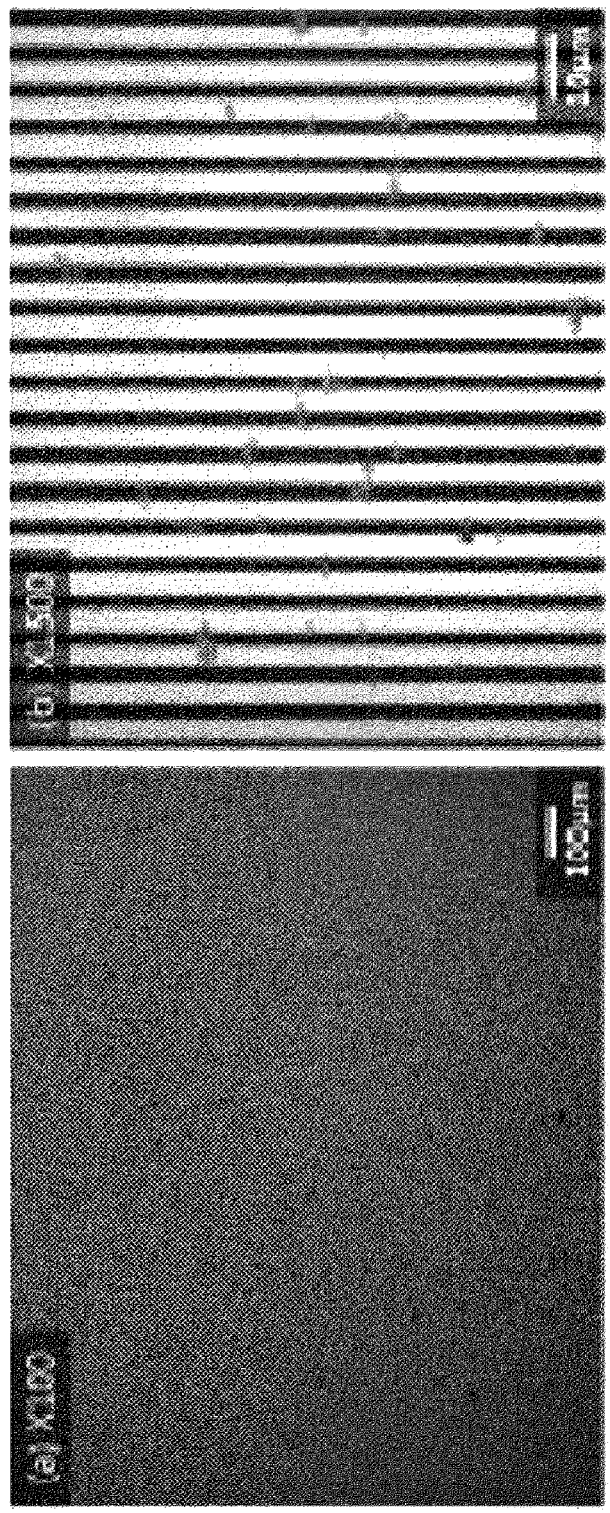

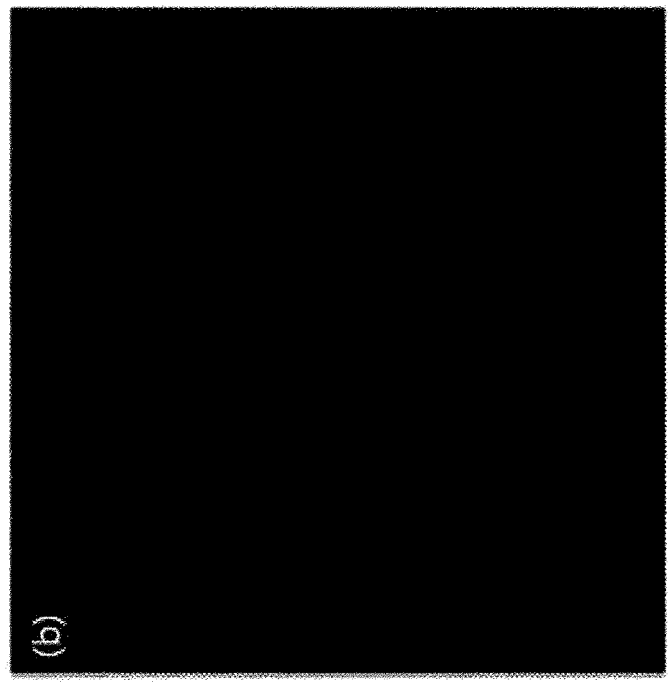
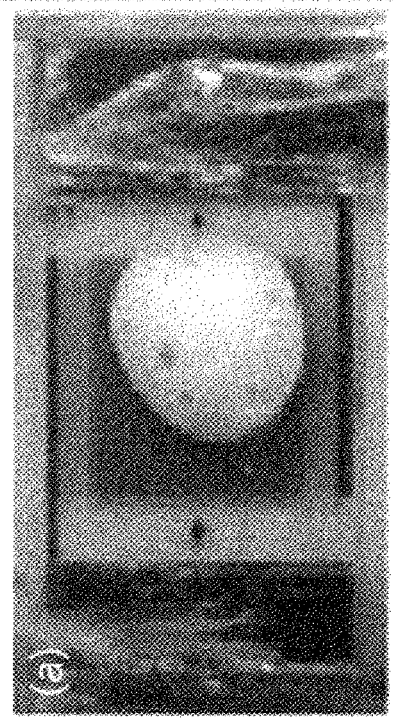
FIG. 5B
FIG. 5A

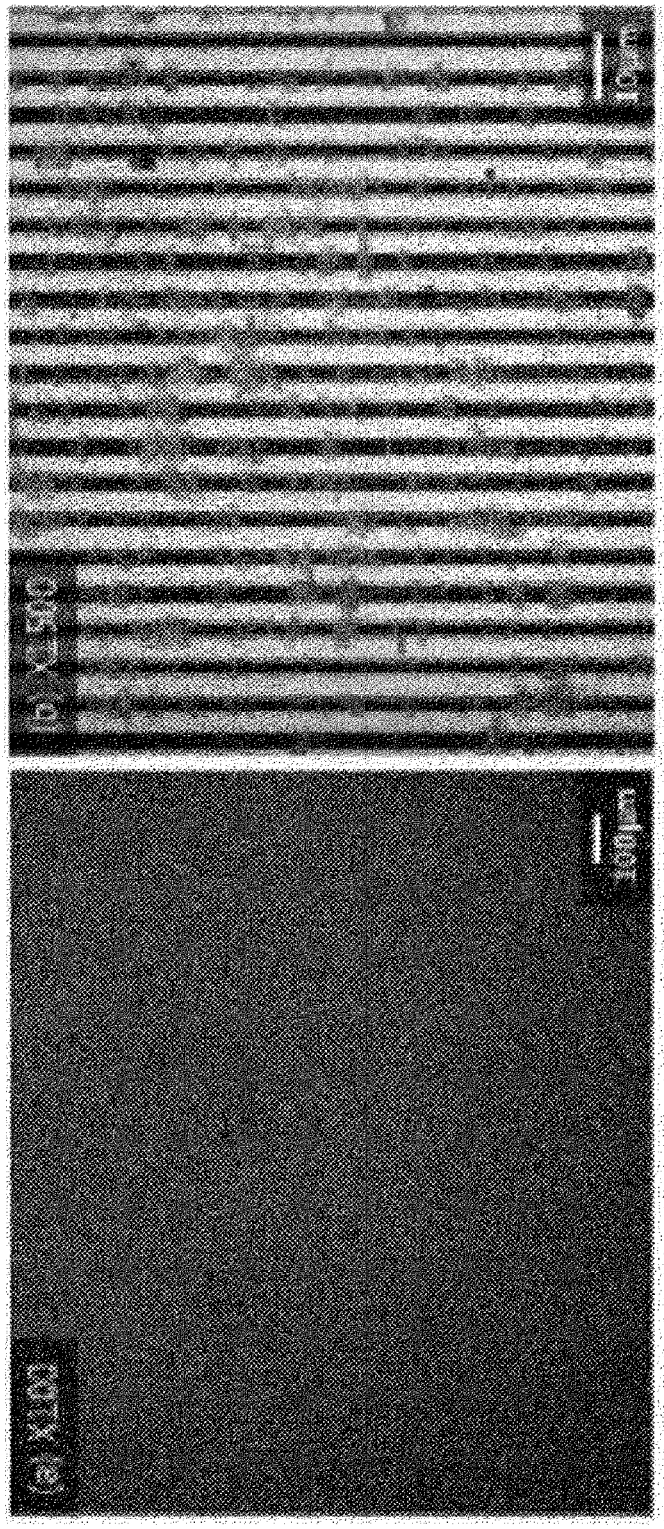

SOLVENT FOR MANUFACTURE OF SELF-ASSEMBLED NANO-SCALE LED ELECTRODE ASSEMBLY AND METHOD FOR MANUFACTURING SELF-ASSEMBLED NANO-SCALE LED ELECTRODE ASSEMBLY BY THE SAME

CROSS-REFERENCE TO RELATED APPLICATIONS

This application claims the priority of Korean Patent Application No. 10-2016-0002270 filed on Jan. 7, 2016, in the Korean Intellectual Property Office, the disclosure of which is incorporated herein by reference.

BACKGROUND

The present disclosure relates to a method for manufacturing a self-assembled nano-scale LED electrode assembly and more particularly, to a method for manufacturing a self-assembled nano-scale LED electrode assembly in which a nano-scale LED device can be self-aligned on two different electrodes without being chemically and physically damaged and the number of nano-scale LED devices to be mounted can be remarkably increased, and alignment and electrical connection of the LED devices can be further improved.

DESCRIPTION OF THE RELATED ART

The development of light emitting diodes (LEDs) has been actively promoted by succeeding in combination of a high-quality single-crystal gallium nitride (GaN) semiconductor by applying a low-temperature GaN compound buffer layer, by Nakamura et al., at Nichia Chemical Corporation in Japan, 1992. Such an LED is a semiconductor having a structure in which an n-type semiconductor crystal having a plurality of carriers, i.e., electrons and a p-type semiconductor crystal having a plurality of carriers, i.e., holes are joined to each other by using characteristics of a compound semiconductor. The LED is a semiconductor device that converts an electrical signal into light having a wavelength band on a desired region to emit the light.

The LED semiconductor is called a revolution of light as a green material because the LED semiconductor has very low energy consumption due to high light conversion efficiency and is semi-permanent in the lifespan and environmentally friendly. Recently, with the advancement of compound semiconductor technologies, red, orange, green, blue, and white LEDs having high brightness have been developed. Also, the LEDs are being applied to various fields such as traffic lights, mobile phones, headlights for vehicles, outdoor electronic display boards, LCD backlight units (LCD BLU), and indoor/outdoor lightings. Further, studies on the LEDs are being actively carried out in Korea and aboard. Particularly, a GaN-based compound semiconductor having a wide band gap is a material used for manufacturing LED semiconductors which emit green and blue light and ultraviolet rays. Further, since a white LED device can be manufactured by using a blue LED device, many studies with respect to the manufacture of the white LED device using the blue LED device are being carried out.

Meanwhile, to utilize the LED device as lightings, displays, and the like, an LED device and an electrode for applying power to the LED device are required. Also, various studies on an arrangement of the LED device and two different electrodes in connection with application purpose, reduction of a space occupied by the electrodes, or a manufacturing method have been carried out.

Studies relating to the arrangement of the LED device and the electrodes may be classified into growth of the LED device and an arrangement of the LED device on the electrodes after the LED device is separately grown.

A study on the growth of the LED device on the electrodes may have a limitation in that it is very difficult to crystallographically grow high crystalline/high efficiency thin film and LED device, and a method of arranging the LED device on the electrodes after the LED device is separately grown may have a limitation in that light extraction efficiency of the LED device is reduced so as to deteriorate light emission efficiency.

Particularly, according to the latter method, in case of a general LED device, it is possible to connect the three-dimensional LED device to the electrodes in a stand-up state, but in case of a nano-scale LED device, it is very difficult to stand the LED device up on the electrodes. In order to solve this problem, Korean Patent Application No. 2011-0040174 discloses a coupling linker for easily coupling a nano-scale LED device to electrodes in a state where the LED device three-dimensionally stands up. Actually, however, it is very difficult to three-dimensionally couple a nano-scale LED device in a stand-up state to electrodes.

Further, in case of nano-scale LED devices, it is very difficult to respectively arrange the LED device on two different electrodes each having a nano-scale pattern within a desired range. Even though the LED device is disposed on the two nano-scale electrodes, defects caused by electrical short-circuit between the electrode and the nano-scale LED may frequently occur, so that a desired electrode assembly cannot be realized.

In order to solve this problem, while continuously studying to manufacture a nano-scale LED electrode assembly, the inventor of the present disclosure found that nano-scale LED devices mixed in a solvent under an electric field are self-aligned on two different electrodes. However, there are very few nano-scale LED devices which are mounted and self-aligned on different electrodes and electrically connected so as to emit light and alignment of the nano-scale LED devices is considerably poor.

SUMMARY

An object to be achieved by the present disclosure is to provide a method for manufacturing a self-assembled nano-scale LED electrode assembly in which a nano-scale LED device can be self-aligned on two different electrodes without being chemically and physically damaged and the number of nano-scale LED devices to be mounted can be remarkably increased, and alignment and electrical connection of the LED devices can be further improved.

Another object to be achieved by the present disclosure is to provide a solvent for manufacture of a self-assembled nano-scale LED electrode assembly which makes it easier for a plurality of nano-scale LED devices to self-align without chemical and physical damage to the nano-scale LED devices, makes it possible to remarkably increase the number of nano-scale LED devices to be mounted, affects induction of electrostatic attraction for movement of the nano-scale LED device on two different electrodes under an electric field so as to improve mobility and self-alignment, and reduces a resistance of the nano-scale LED device to movement so as to further improve the mobility, and a method for manufacturing a self-assembled nano-scale LED electrode assembly using the solvent.

According to an aspect of the present disclosure, there is provided a method for manufacturing a self-assembled nano-scale LED electrode assembly, including (1) a step of inputting a plurality of nano-scale LED devices and a solvent to an electrode line including a base substrate, a first mounting electrode formed on the base substrate, and a second mounting electrode formed as being spaced from the first mounting electrode on the same plane as the first mounting electrode, and (2) a step of self-aligning the plurality of nano-scale LED devices by applying power to the electrode line to connect ends of a nano-scale LED device to the first mounting electrode and the second mounting electrode, respectively. Herein, the solvent satisfies the following conditions (a) and (b).

(a) A dipole moment is 1.5 D or more.

(b) An electrical conductivity is 5 μS/m or more at 20° C.

According to an exemplary embodiment of the present disclosure, the solvent may further satisfy the following conditions (c) and (d).

(c) A boiling point is 30° C. to 85° C.

(d) A vapor pressure is 3 kPa to 100 kPa at 20° C.

According to another exemplary embodiment of the present disclosure, the solvent may have a viscosity of 0.3 cP to 1 cP at 20° C.

According to yet another exemplary embodiment of the present disclosure, the conditions (a) and (b) for the solvent may be the following conditions (e) and (f).

(e) A dipole moment is 2.5 D to 5.0 D.

(f) An electrical conductivity is 10 μS/m to 500 μS/m at 20° C.

According to still another exemplary embodiment of the present disclosure, the nano-scale LED device may have an aspect ratio of 1.2 to 100.

According to still another exemplary embodiment of the present disclosure, the nano-scale LED device may have a length of 100 nm to 10 μm.

According to still another exemplary embodiment of the present disclosure, the power applied in the step (2) may have a voltage (amplitude) of 0.1 $V_{pp}$ to 1000 $V_{pp}$ and a frequency of 10 Hz to 100 GHz.

According to still another exemplary embodiment of the present disclosure, the nano-scale LED device may further include a hydrophobic film coated on an external surface of an insulating film in order to suppress aggregation between the devices.

Meanwhile, according to another aspect of the present disclosure, there is provided a solvent for manufacture of a self-assembled nano-scale LED electrode assembly which moves and self-align a nano-scale LED device located in a region of an electrode line applied with power to two different mounting electrodes of the electrode line and satisfies the following conditions (a) and (b).

(a) A dipole moment is 1.5 D or more.

(b) An electrical conductivity is 5 μS/m or more at 20° C.

According to an exemplary embodiment of the present disclosure, the solvent may further satisfy the following conditions (c) and (d).

(c) A boiling point is 30° C. to 85° C.

(d) A vapor pressure is 3 kPa to 100 kPa at 20° C.

According to another exemplary embodiment of the present disclosure, the solvent may have a viscosity of 0.3 cP to 1 cP at 20° C.

According to yet another exemplary embodiment of the present disclosure, the conditions (a) and (b) for the solvent may be the following conditions (e) and (f).

(e) A dipole moment is 2.5 D to 5 D.

(f) An electrical conductivity is 10 μS/m to 500 μS/m at 20° C.

The terms "first mounting electrode" and "second mounting electrode" used herein may include an electrode region where nano-scale LED devices can be substantially mounted or an electrode region which may be included in addition to the above-described region depending on a method of arranging electrodes on a base substrate.

Further, the term "$V_{pp}$" used herein refers to a difference between the minimum voltage and the maximum voltage (peak to peak voltage), and means a difference between the minimum voltage amplitude and the maximum voltage amplitude when alternating-current power is applied in the present disclosure.

The solvent for manufacture of a self-assembled nano-scale LED electrode assembly according to an exemplary embodiment of the present disclosure does not make a chemical or physical reaction with the nano-scale LED devices. Thus, the solvent does not damage the nano-scale LED devices and the electrode line during a manufacturing process regardless of application of power, so that a defect rate of the nano-scale LED electrode assembly can be reduced. Further, the solvent affects induction of electrostatic attraction when the nano-scale LED device moves on two different electrodes so as to facilitate self-alignment of the plurality of nano-scale LED devices, and also improves self-alignment of the nano-scale LED device and reduces a resistance of the nano-scale LED device to movement so as to improve mobility of the nano-scale LED device and increase the number of nano-scale LED devices to be mounted.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 1A through 1C provide perspective views illustrating a process of manufacturing a self-assembled nano-scale LED electrode assembly according to an exemplary embodiment of the present disclosure;

FIG. 2 is a perspective view of a nano-scale LED device according to an exemplary embodiment of the present disclosure;

FIGS. 4A and 4B provide photographs of the self-assembled nano-scale LED electrode assembly of FIGS. 3A through 3C magnified with an optical microscope;

FIGS. 5A and 5B provide blue electroluminescent photographs of a self-assembled nano-scale LED electrode assembly manufactured using a solvent according to an exemplary embodiment of the present disclosure;

FIGS. 10A and 10B provide photographs of the self-assembled nano-scale LED electrode assembly of FIGS. 9A through 9C magnified with an optical microscope.

DETAILED DESCRIPTION OF THE EMBODIMENT

Hereinafter, the present disclosure will be described in more detail with reference to the accompanying drawings.

As described above, while continuously studying to solve the problem of difficulty in mounting a nano-scale LED device on a nano-scale electrode, the inventor of the present disclosure found that a nano-scale LED device mixed in a solvent under an electric field is self-aligned on two different electrodes. However, there are very few nano-scale LED devices which are mounted and self-aligned on different electrodes and electrically connected so as to emit light and alignment of the nano-scale LED devices is considerably poor.

Accordingly, the present disclosure is conceived to solve the above-described problem by providing a method for manufacturing a self-assembled nano-scale LED electrode assembly, including (1) a step of inputting a plurality of nano-scale LED devices and a solvent to an electrode line including a base substrate, a first mounting electrode formed on the base substrate, and a second mounting electrode formed as being spaced from the first mounting electrode on the same plane as the first mounting electrode, and (2) a step of self-aligning the plurality of nano-scale LED devices by applying power to the electrode line to connect ends of a nano-scale LED device to the first mounting electrode and the second mounting electrode, respectively, wherein the solvent satisfies conditions (a) and (b) to be described later. Thus, a chemical or physical reaction is not made with the nano-scale LED devices, and, thus, the nano-scale LED devices and the electrode line are not damaged during a manufacturing process regardless of application of power, so that a defect rate of the nano-scale LED electrode assembly can be reduced. Therefore, a nano-scale LED device can float and the plurality of nano-scale LED devices can be self-aligned, so that self-alignment of the nano-scale LED devices can be improved and the number of nano-scale LED devices to be mounted can be increased.

Firstly, the step (1) according to the present disclosure for manufacturing a nano-scale LED electrode assembly will be described.

In the step (1), a plurality of nano-scale LED devices and a solvent are inputted to an electrode line including a base substrate, a first mounting electrode formed on the base substrate, and a second mounting electrode formed as being spaced from the first mounting electrode on the same plane as the first mounting electrode.

Figure 1B:
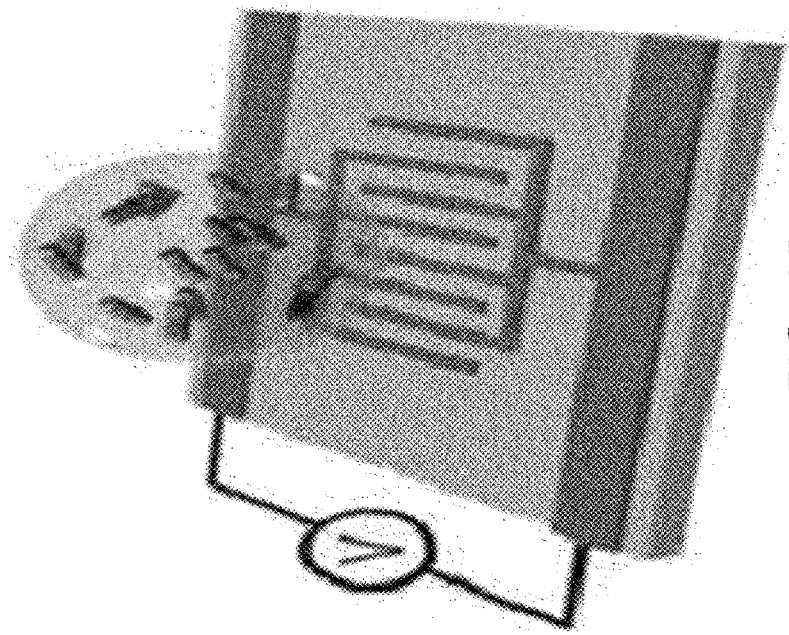
Figure 1A:
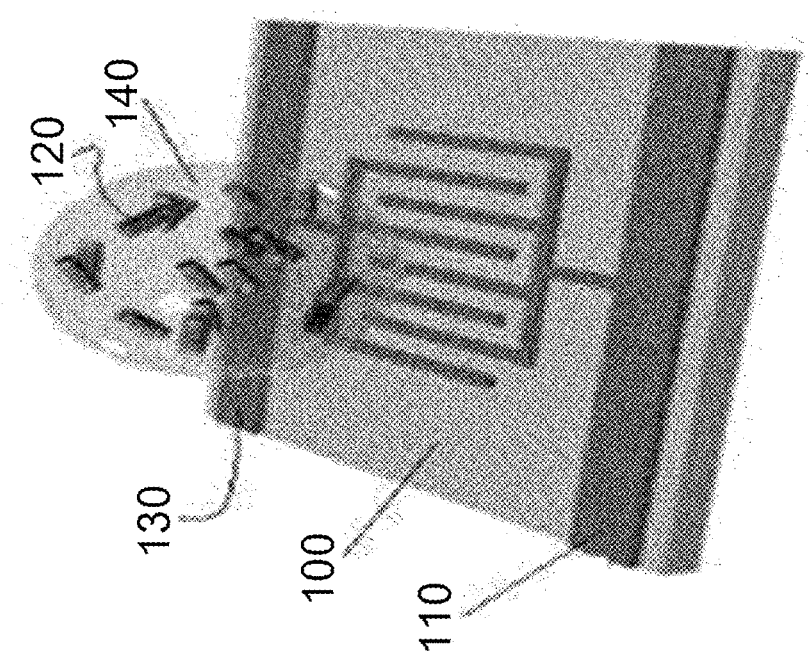

Specifically, FIGS. 1A through 1C provide perspective views illustrating a process of manufacturing a self-assembled nano-scale LED electrode assembly according to an exemplary embodiment of the present disclosure. FIG. 1A illustrates a first mounting electrode 110 formed on a base substrate 100, a second mounting electrode 130 formed as being spaced from the first mounting electrode on the same plane as the first mounting electrode, a plurality of nano-scale LED devices 120, and a solvent 140.

As for the nano-scale LED electrode assembly, Korean Patent No. 10-1490758 and Korean Patent Application No. 2014-0085384 filed by the inventor of the present disclosure may be incorporated herein by reference. Therefore, details of structures, shapes, and materials of the electrodes and a method for manufacturing the electrode line will be omitted.

Firstly, the nano-scale LED devices 120 will be described. Hereinafter, in the description of the nano-scale LED device, the terms "above", "below", "up", "down", "upper", and "lower" may denote vertical upper and lower directions with respect to each layer included in the nano-scale LED device.

The nano-scale LED device may be used without limitations as long as it can be generally used for lightings or displays. Preferably, the nano-scale LED device may include a first conductive semiconductor layer, an active layer disposed on the first conductive semiconductor layer, and a second conductive semiconductor layer disposed on the active layer, and may further include a first electrode layer under the first conductive semiconductor layer and a second electrode layer on the second conductive semiconductor layer. The nano-scale LED device may have a three-layer structure or five-layer structure.

Further, the nano-scale LED device may have a length of 100 nm to 10 μm, more preferably 500 nm to 5 μm. If the nano-scale LED device has a length of less than 100 nm, it may be difficult to manufacture an LED device having high efficiency. If the nano-scale LED device has a length of more than 10 μm, light emission efficiency of the LED device may be decreased. The nano-scale LED device may have various shapes such as a cylindrical shape and a rectangular parallelepiped shape, preferably, the cylindrical shape, but is not limited thereto.

Specifically, FIG. 2 is a perspective view of a nano-scale LED device according to an exemplary embodiment of the present disclosure, and illustrates an active layer 22 disposed on a first conductive semiconductor layer 21 on a first electrode layer 11, a second conductive semiconductor layer 23 disposed on the active layer 22, and a second electrode layer 12 on the second conductive semiconductor layer 23.

Firstly, the first electrode layer 11 will be described.

The first electrode layer 11 may be formed of metal or metal oxide that is used for an electrode of a general LED device, preferably, one or mixture of chrome (Cr), titanium (Ti), aluminum (Al), gold (Au), nickel (Ni), ITO, and oxides or alloys thereof, but is not limited thereto. Preferably, the first electrode layer may have a thickness of 1 nm to 100 nm, but is not limited thereto. If the first electrode layer is provided, the first semiconductor layer and the electrode line can be joined to each other at a lower temperature than a temperature required for a process of forming a metal ohmic layer at a connection portion between the first semiconductor layer and the electrode line.

Hereinafter, the first conductive semiconductor layer 21 disposed on the first electrode layer 11 will be described. The first conductive semiconductor layer 21 may include, for example, an n-type semiconductor layer. If the nano-scale LED device is a blue light emitting device, the n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., any one or more selected from InAlGaN, GaN, AlGaN, InGaN, AlN, and InN, and may be doped with a first conductive dopant (e.g., Si, Ge, Sn, etc.). Preferably, the first conductive semiconductor layer 21 may have a thickness of 500 nm to 5 μm, but is not limited thereto. A color of light emitted by the nano-scale LED is not limited to blue, and, thus, if the light color is different, different kinds of III-V group semiconductor materials may be used for the n-type semiconductor layer without limitations.

Hereinafter, the active layer 22 disposed on the first conductive semiconductor layer 21 will be described. If the nano-scale LED device is a blue light emitting device, the active layer 22 may be disposed on the first conductive semiconductor layer 21 and may have a single or multi quantum well structure. A clad layer (not illustrated) which is doped with a conductive dopant may be disposed on and/or under the active layer 22. The clad layer doped with the conductive dopant may be implemented as an AlGaN layer or an InAlGaN layer. In addition, materials such as AlGaN and AlInGaN may also be used for the active layer 12. When electric fields are applied to the active layer 22, light may be generated due to coupling of electron-hole pairs. Preferably, the active layer may have a thickness of 10 nm to 200 nm, but is not limited thereto. The active layer may be disposed at various positions depending on the kind of an LED. A color of light emitted by the nano-scale LED is not limited to blue, and, thus, if the light color is different, different kinds of III-V group semiconductor materials may be used without limitations.

Hereinafter, the second conductive semiconductor layer 23 disposed on the active layer 22 will be described. If the nano-scale LED device is a blue light emitting device, the second conductive semiconductor layer 23 is disposed on the active layer 22, and the second conductive semiconductor layer 23 may be implemented as at least one p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., any one or more selected from InAlGaN, GaN, AlGaN, InGaN, AlN, and InN, and may be doped with a second conductive dopant (e.g., Mg). Herein, a light emitting structure may include the first conductive semiconductor layer 21, the active layer 22, and the second conductive semiconductor layer 23 as minimum components. Also, the light emitting structure may further include the other phosphor layer, active layer, semiconductor layer, and/or electrode layer above/below each layer. Preferably, the second conductive semiconductor layer 23 may have a thickness of 50 nm to 500 nm, but is not limited thereto. A color of light emitted by the nano-scale LED is not limited to blue, and, thus, if the light color is different, different kinds of III-V group semiconductor materials may be used for the p-type semiconductor layer without limitations.

Hereinafter, the second electrode layer 12 disposed on the second conductive semiconductor layer 23 will be described.

The second electrode layer 12 may be formed of metal or metal oxide that is used for an electrode of a general LED device, preferably, one or mixture of chrome (Cr), titanium (Ti), aluminum (Al), gold (Au), nickel (Ni), ITO, and oxides or alloys thereof, but is not limited thereto. Preferably, the second electrode layer may have a thickness of 1 nm to 100 nm, but is not limited thereto. If the second electrode layer is provided, the second semiconductor layer and the electrode line can be joined to each other at a lower temperature than a temperature required for a process of forming a metal ohmic layer at a connection portion between the second semiconductor layer and the electrode line.

Meanwhile, the nano-scale LED device included in the nano-scale LED electrode assembly according to the present disclosure may include an insulation film 30 covering the whole external surface of a portion of at least active layer on an external surface of the nano-scale LED device to suppress electrical short-circuit caused by contact between the active layer 22 of the nano-scale LED device and the electrode line included in the nano-scale LED electrode assembly.

Also, preferably, the insulation film 30 may be applied to at least one external surface of the first and second semiconductor layers 21 and 23 to suppress the electrical short-circuit and deterioration in durability of the nano-scale LED device caused by damage of the external surface of the semiconductor layer.

Specifically, in FIG. 2, the insulation film 30 covers the external surfaces of the first conductive semiconductor layer 21, the active layer 22 and the second conductive semiconductor layer 23.

The insulation film 30 functions to suppress the electrical short-circuit occurring when the active layer of the nano-scale LED device is in contact with the electrode. Also, the insulation layer 30 may protect the external surface in addition to the active layer of the nano-scale LED device so as to suppress a defect on an external surface of the device and thus suppress deterioration in light emission efficiency.

If each of the nano-scale LED devices is disposed and connected one by one between two different electrodes, it is possible to suppress the electrical short-circuit caused by contact between the active layer and the electrodes. However, it may be difficult to physically mount the nano-scale LED device having the nano unit one by one on the electrode. Thus, when power is applied to self-align the nano-scale LED device between the two different electrodes, the nano-scale LED device may be changed in position through movement and alignment between the two different electrodes. In this process, the external surface of the active layer 22 of the nano-scale LED device may be brought into contact with the electrode line, so that the electrical short-circuit may frequently occur.

Meanwhile, if the nano-scale LED device stands up on the electrode, the electrical short-circuit caused by contact between the active layer and the electrode line may not occur. That is, only when the nano-scale LED device does not stand up on the electrode but lies on the electrode, the active layer and the electrode line can be in contact with each other. In this case, the nano-scale LED device may not be connected to the two different electrodes, but the electrical short-circuit may not occur.

Meanwhile, according to an exemplary embodiment of the present disclosure, the insulation film 30 may not coat at least any one of the first electrode layer 11 and the second electrode layer 12 of the nano-scale LED device, and more preferably, the insulation film may not coat both the electrode layers 11 and 12. In this regard, the two electrode layers 11 and 12 need to be electrically connected to the two different electrodes, but if the two electrode layers 11 and 12 are coated with the insulation film 30, the insulation film 30 may disrupt the electrical connections. Thus, light emission of the nano-scale LED may be decreased, or the electrical connections may not be made, and, thus, light may not be emitted. However, if the two electrode layers 11 and 12 of the nano-scale LED device are electrically connected to the two different electrodes, the nano-scale LED device may have no problem with light emission. Therefore, the two electrode layers 11 and 12 except ends of the electrode layers 11 and 12 of the nano-scale LED device may include the insulation film 30.

According to an exemplary embodiment of the present disclosure, the nano-scale LED device may further include a hydrophobic film 40 on the insulation film 30. The hydrophobic film 40 may provide a hydrophobic property on the surface of the nano-scale LED device to suppress aggregation between the LED devices. When the nano-scale LED device is mixed in a solvent, the aggregation between the nano-scale LED devices may be minimized to remove deterioration in characteristics of the independent nano-scale LED device. Also, when power is applied to the electrode line, each of the nano-scale LED devices may be more easily aligned in position.

The hydrophobic film 40 may be disposed on the insulation film 30. In this case, the hydrophobic film may be used without limitations as long as the hydrophobic film is disposed on the insulation film to suppress the aggregation between the nano-scale LED devices. Preferably, the hydrophobic film may be formed of one or mixture of self-assembled monolayers (SAMs) such as octadecyltrichlorosilane, (OTS), fluoroalkyltrichlorosilane, and perfluoroalkyltriethoxysilane and fluoropolymer such as Teflon and cytop, but is not limited thereto.

Hereinafter, the solvent 140 inputted in the step (1) of the present disclosure will be described.

According to the method for manufacturing a self-assembled nano-scale LED electrode assembly, the solvent does not chemically or physically damage nano-scale LED devices, enables a plurality of nano-scale LED devices to be more easily self-aligned, remarkably increases the number of nano-scale LED devices to be mounted, induces electrostatic attraction when the nano-scale LED device moves on two different electrodes so as to improve mobility and self-alignment, and reduces a resistance of the nano-scale LED device to movement so as to further improve mobility of the nano-scale LED device.

Further, the inputted solvent needs to be easily vaporized during the manufacturing process. Preferably, the solvent needs to be easily vaporized by electric energy applied to self-align the nano-scale LED devices without additional heat energy or the like. If the solvent cannot be easily vaporized, additional energy may be added to vaporize the solvent or a time required for manufacture may be increased, which may cause deterioration in productivity and increase in production cost. Further, after the devices are primarily self-aligned and mounted on respectively mounted on different electrodes, if an electric field is dissipated before all the solvent is vaporized, the devices may physically move due to the remaining solvent, which may cause deterioration in alignment or deviation of the mounted devices from the electrodes in severe cases.

Thus, the solvent used for manufacture of the nano-scale LED electrode assembly may satisfy a dipole moment of 1.5 D or more, preferably 2.5 D or more, and more preferably 2.5 D to 5.0 D, which is the condition (a) of the present disclosure.

Further, the solvent may satisfy an electrical conductivity of 5 μS/m or more, preferably 10 μS/m or more, and more preferably 10 μS/m to 500 μS/m, at 20° C., which is condition (b) of the present disclosure.

If the solvent 140 does not satisfy the above-described conditions (a) and (b), when external power is applied, the solvent 140 cannot affect induction of electrostatic attraction. Therefore, the nano-scale LED devices 120 may not be self-aligned and vaporization of the solvent 140 by electric energy may not be easily induced.

Figure 3C:
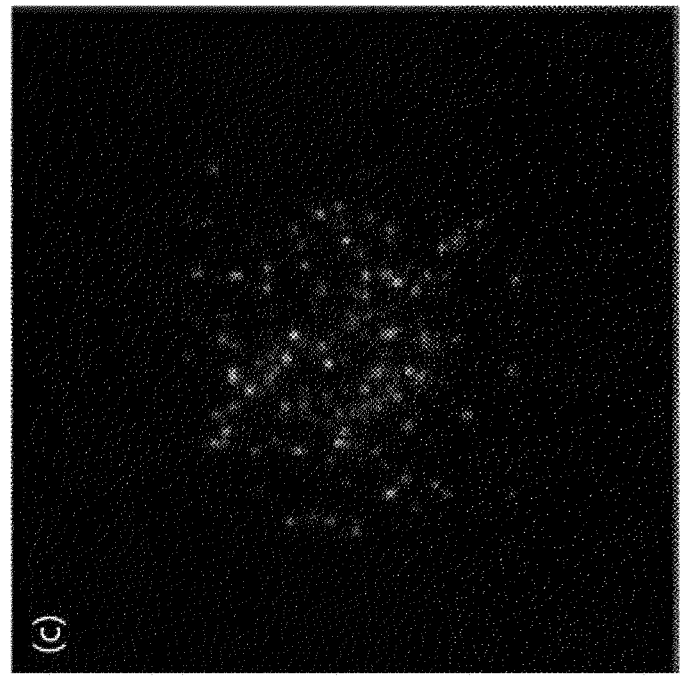
FIGS. 3A through 3C provide blue electroluminescent photographs of a self-assembled nano-scale LED electrode assembly implemented using a solvent according to Comparative Example.
Figure 3A:
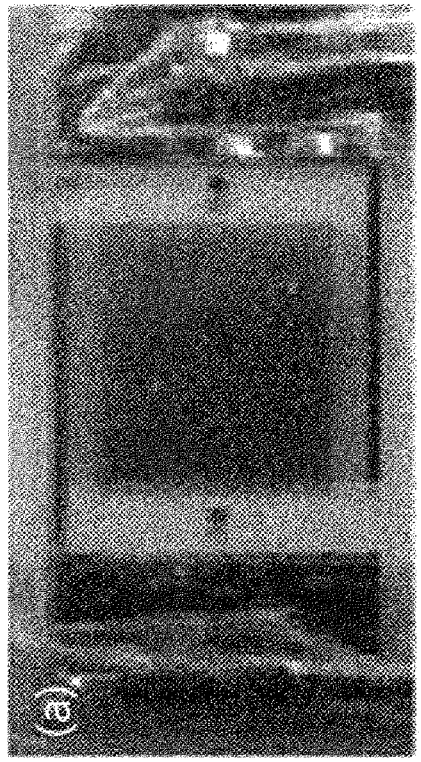
Figure 3B:
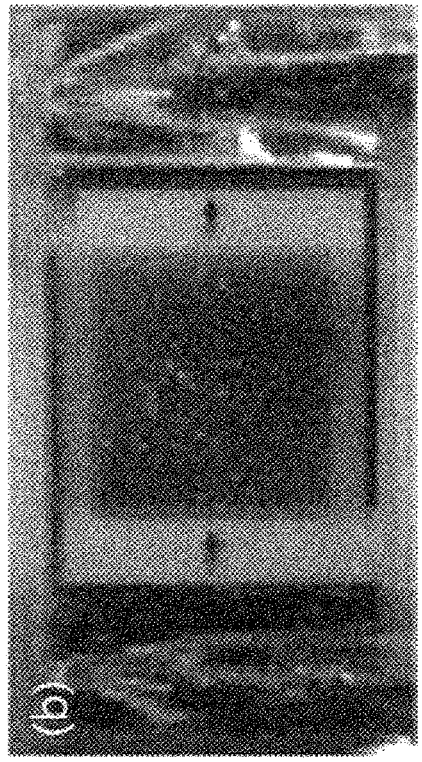

Specifically, FIGS. 3A through 3C provide blue electroluminescent photographs of a self-assembled nano-scale LED electrode assembly implemented using n-hexane as a solvent according to Comparative Example of the present disclosure. FIG. 3A is a photograph photographed in a bright room before nano-scale LED devices emit light, FIG. 3B is a blue electroluminescent photograph of the nano-scale LED devices photographed in a bright room, and FIG. 3C is a blue electroluminescent photograph of the nano-scale LED devices photographed in a dark room.

The n-hexane has a dipole moment of 0.08 D and has an electrical conductivity of less than $10^{-6}$ at 20° C. and thus cannot satisfy the above-described conditions (a) and (b). The n-hexane is a non-polar solvent having very low dipole moment and electrical conductivity. If only such a solvent is used for self-alignment, external power cannot electrically affect the solvent, so that vaporization of the solvent is not induced. Even in this case, the nano-scale LED devices emitting light are shown in FIGS. 3A through 3C. This is because although vaporization of the solvent is not induced by the external power, some of the nano-scale LED devices are aligned while the solvent is naturally vaporized.

Further, FIGS. 4A and 4B provide photographs of the self-assembled nano-scale LED electrode assembly of FIGS. 3A through 3C magnified with an optical microscope. Specifically, FIG. 4A is a 100 times magnified optical microscopic photograph of the nano-scale LED electrode assembly implemented by inputting n-hexane, and FIG. 4B is a 1500 times magnified optical microscopic photograph of the nano-scale LED electrode assembly implemented by inputting n-hexane. It can be seen from FIGS. 4A and 4B that nano-scale LED devices are rarely mounted.

Meanwhile, preferably, the solvent may have a dipole moment of 2.5 D to 5.0 D. If the dipole moment is higher than 5.0 D, attraction between solvent molecules may be increased, so that the solvent may not be readily vaporized and thus may continuously affect the nano-scale LED devices. Further, preferably, the solvent may have an electrical conductivity of 10 μS/m to 500 μS/m at 20° C. If the electrical conductivity at 20° C. is higher than 500 μS/m, a high current may flow through the solvent and electrical short-circuit may occur, so that the electrode line may be damaged or there may be a problem with external power for self-alignment.

Furthermore, the solvent 140 may satisfy a boiling point of 30° C. to 85° C., which is the condition (c) of the present disclosure, and may satisfy a vapor pressure of 3 kPa to 100 kPa at 20° C., which is the condition (d) of the present disclosure.

If the solvent 140 does not satisfy the above-described conditions (c) and (d) and the boiling point is higher than 85° C. and/or the vapor pressure is lower than 3 kPa, when alternating-current power is applied to the electrodes, boiling occurs at a high temperature, so that the nano-scale LED devices 120 and/or the electrodes burn out and the process cannot be further performed. Also, the nano-scale LED devices 120 are not self-aligned. If the boiling point is lower than 30° C. and/or the vapor pressure is higher than 1000 kPa, the solvent tends to naturally vaporize regardless of application of external power. Thus, it may be difficult to induce self-alignment of the nano-scale LEDs on the electrode line.

Specifically, FIGS. 5A and 5B provide blue electroluminescent photographs of a self-assembled nano-scale LED electrode assembly manufactured using a solvent according to an exemplary embodiment of the present disclosure. FIG. 5A is a photograph photographed in a bright room before and after nano-scale LED devices emit light, and FIG. 5B is a blue electroluminescent photograph of the nano-scale LED devices photographed in a dark room. The solvent is distilled water having a boiling point of 100° C. and a vapor pressure of 2.338 kPa at 20° C. and thus cannot satisfy the above-described conditions (c) and (d). The distilled water has a high boiling point. Thus, if the distilled water is used, when power is applied to the electrodes, boiling occurs, so that the electrodes burn out and the nano-scale LED devices 120 are not at all self-aligned. It can be seen that even if some of the nano-scale LED devices 120 are self-aligned, the electrodes burn out, and, thus, light is not emitted.

Figures 6A, 6B:
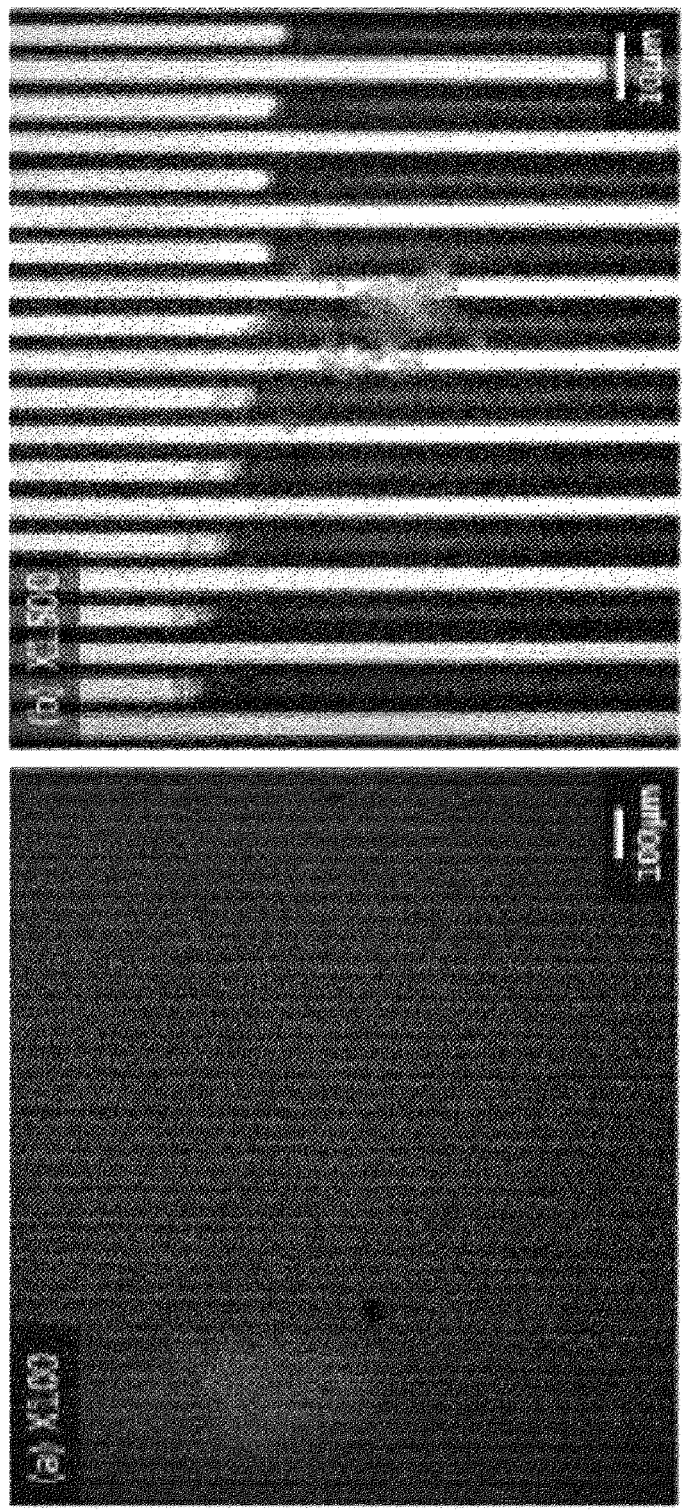
FIGS. 6A and 6B provide photographs of the self-assembled nano-scale LED electrode assembly of FIGS. 5A and 5B magnified with an optical microscope.

Further, FIGS. 6A and 6B provide photographs of the self-assembled nano-scale LED electrode assembly of FIGS. 5A and 5B magnified with an optical microscope. Specifically, FIG. 6A is a 100 times magnified optical microscopic photograph of the nano-scale LED electrode assembly implemented by inputting distilled water, and FIG. 6B is a 1500 times magnified optical microscopic photograph of the nano-scale LED electrode assembly implemented by inputting distilled water. It can be seen from FIGS. 6A and 6B that nano-scale LED devices are not at all mounted but concentrated and aggregated at only one portion.

Meanwhile, according to another exemplary embodiment of the present disclosure, the solvent 140 may have a viscosity of 0.3 cP to 1 cP at 20° C. If the viscosity at 20° C. is lower than 0.3 cP, the nano-scale LED devices do not float but only the solvent is excessively spread. Thus, the nano-scale LED devices may not be spread well. If the viscosity at 20° C. is higher than 1 cP, the nano-scale LED devices 120 may be aligned but mounted only within a droplet of a solution including the solvent 140 and the nano-scale LED devices 120. Therefore, the nano-scale LED devices 120 cannot be entirely mounted on a desired mounting region and cannot be uniformly distributed. This means that when the nano-scale LED devices 120 are self-aligned, spreadability of the nano-scale LED devices 120 in the electrode region is considerably decreased. Further, a nano-scale LED electrode assembly in which nano-scale LED devices are excessively mounted on a specific portion of an electrode region considerably increases electrical short-circuit of the electrode at the specific portion during use, so that durability may be decreased or light may not be emitted. Furthermore, there may be remarkable difference between the intensity of light emitted from the portion where the nano-scale LED devices are excessively concentrated and mounted and the intensity of light emitted from the other portions, so that light may be emitted in a non-uniform manner.

Also, the electrode may be affected mainly by the portion where the nano-scale LED devices are excessively self-aligned. In this case, electrical short-circuit may occur in the electrode line and the nano-scale LED devices 120 aligned on the electrode line where the electrical short-circuit occurs may be electrically disconnected, and, thus, light may not be emitted.

Figure 7C:
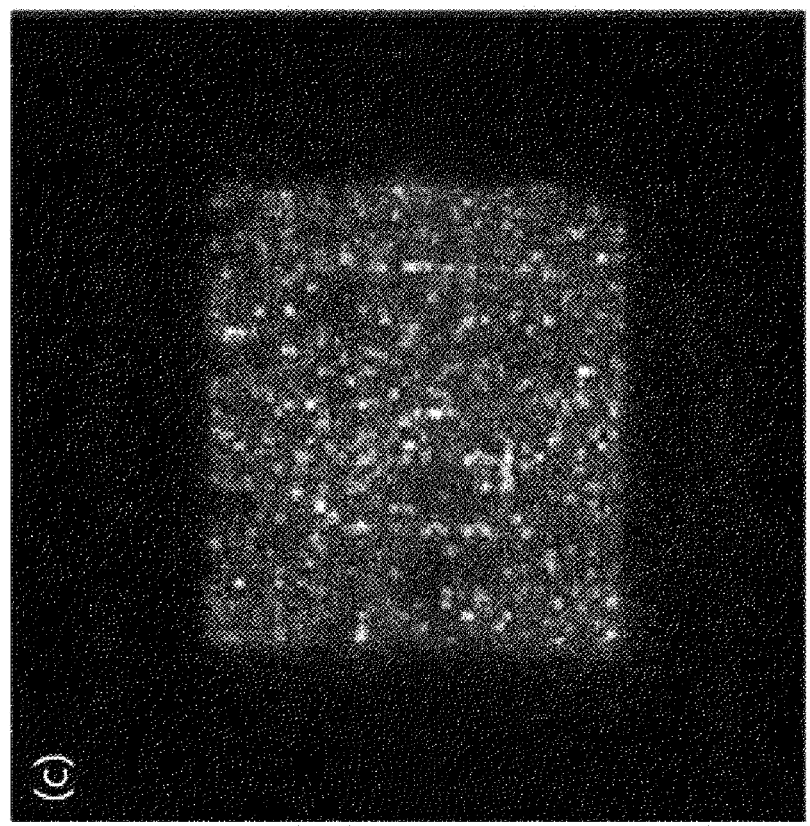
FIGS. 7A through 7C provide blue electroluminescent photographs of a self-assembled nano-scale LED electrode assembly manufactured using a solvent according to another exemplary embodiment of the present disclosure.
Figure 7A:
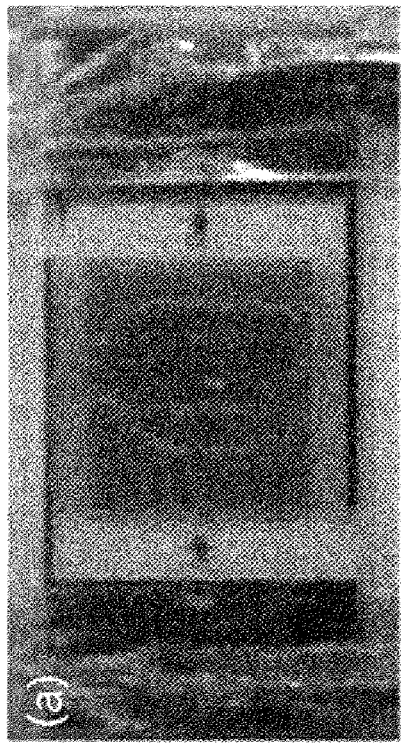
Figure 7B:
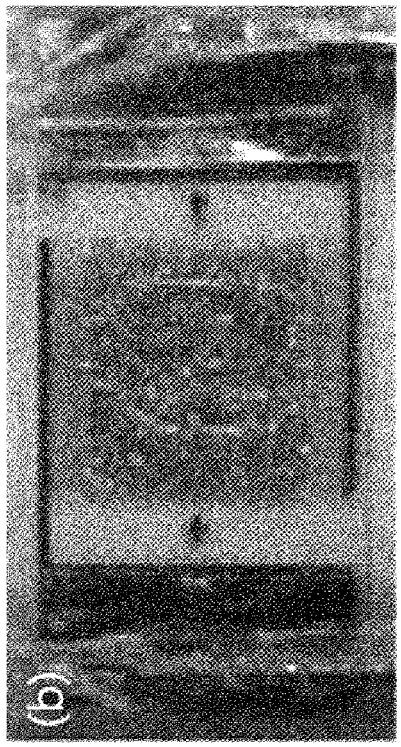

Specifically, FIGS. 7A through 7C provide blue electroluminescent photographs of a self-assembled nano-scale LED electrode assembly manufactured using a solvent according to another exemplary embodiment of the present disclosure. FIG. 7A is a photograph photographed in a bright room before nano-scale LED devices emit light, FIG. 7B is a blue electroluminescent photograph of the nano-scale LED devices photographed in a bright room, and FIG. 7C is a blue electroluminescent photograph of the nano-scale LED devices photographed in a dark room. The solvent is isopropyl alcohol having a viscosity of 2.3703 cP at 20° C. and thus cannot satisfy the above-described viscosity condition. As can be seen from FIGS. 7A through 7C, since the isopropyl alcohol has a high viscosity, when power is applied, the nano-scale LED devices are self-aligned but excessively concentrated and aligned forming a white band along a droplet of a solution including the nano-scale LED devices and the solvent. This means that when the nano-scale LED devices are self-aligned, the nano-scale LED devices are not spread well. Further, the electrode may be affected mainly by the portion where the nano-scale LED devices are excessively self-aligned. In severe cases, electrical short-circuit may occur in the electrode line and the nano-scale LED devices aligned on the electrode line where the electrical short-circuit occurs may be electrically disconnected, and, thus, light may not be emitted.

Figure 8B:
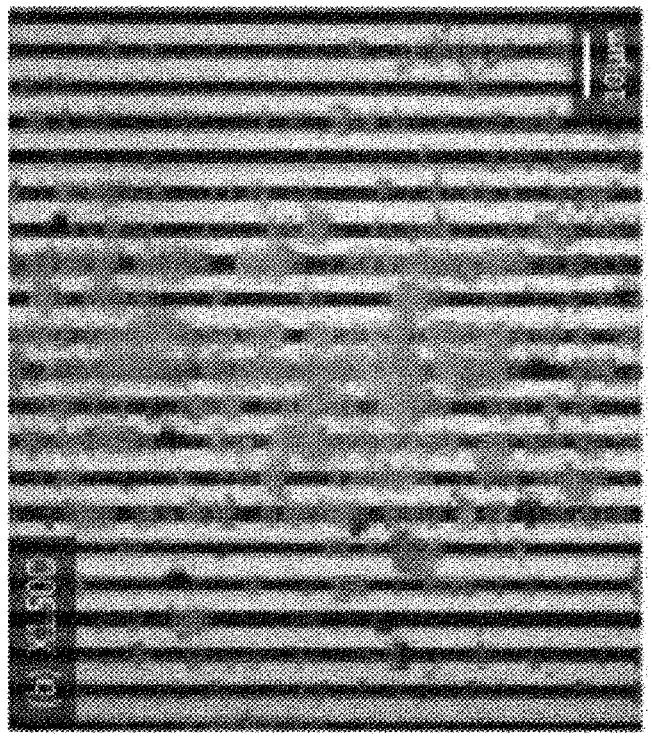
FIGS. 8A and 8B provide photographs of the self-assembled nano-scale LED electrode assembly of FIGS. 7A through 7C magnified with an optical microscope.
Figure 8A:
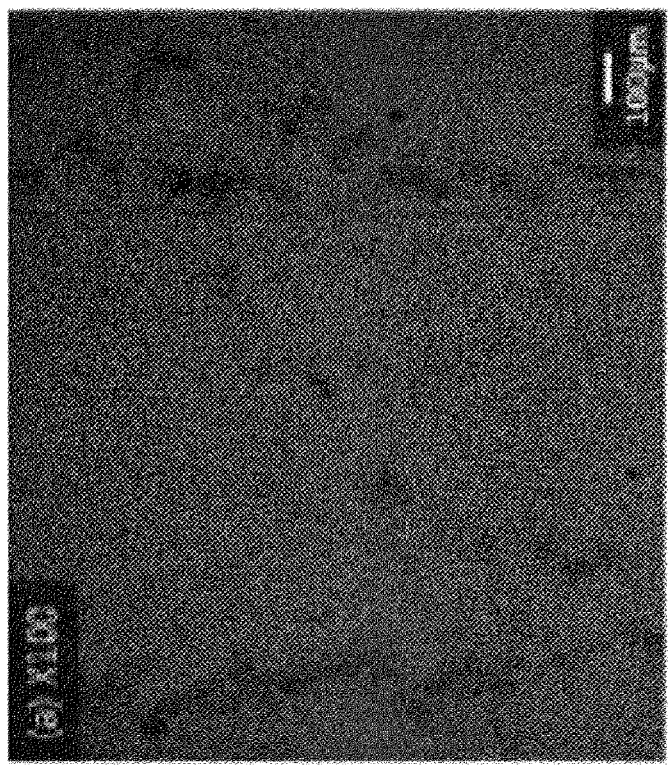

Further, FIGS. 8A and 8B provide photographs of the self-assembled nano-scale LED electrode assembly of FIGS. 7A through 7C magnified with an optical microscope. FIG. 8A is a 100 times magnified optical microscopic photograph of the nano-scale LED electrode assembly implemented by inputting isopropyl alcohol, and FIG. 8B is a 1500 times magnified optical microscopic photograph of the nano-scale LED electrode assembly implemented by inputting isopropyl alcohol. It can be seen from FIGS. 8A and 8B that nano-scale LED devices are self-aligned but concentrated and aggregated in a central portion without being uniformly distributed to outer peripheries of the electrode line since the solvent having a high viscosity is used.

Meanwhile, a solution including the solvent 140 satisfying the above-described conditions (a) and (b) can induce electrostatic attraction to improve mobility when the nano-scale LED device 120 moves on the two different electrodes so as to facilitate self-alignment of the nano-scale LED device 120 and can easily induce vaporization of the solvent 140 when power is applied, due to the dipole moment of the solvent satisfying the condition (a) and the electrical conductivity satisfying the condition (b). Further, due to the boiling point satisfying the condition (c) and the vapor pressure satisfying the condition (d), the solvent 140 can be more easily vaporized without affecting the electrode line and the nano-scale LED devices 120 when power is applied. Furthermore, since the viscosity is 0.3 cP to 1 cP, a resistance of the nano-scale LED devices 120 to movement is reduced so as to improve mobility, and the nano-scale LED devices 120 can be more readily spread on the electrode line due to high spreadability and thus can be uniformly self-aligned.

Figure 9C:
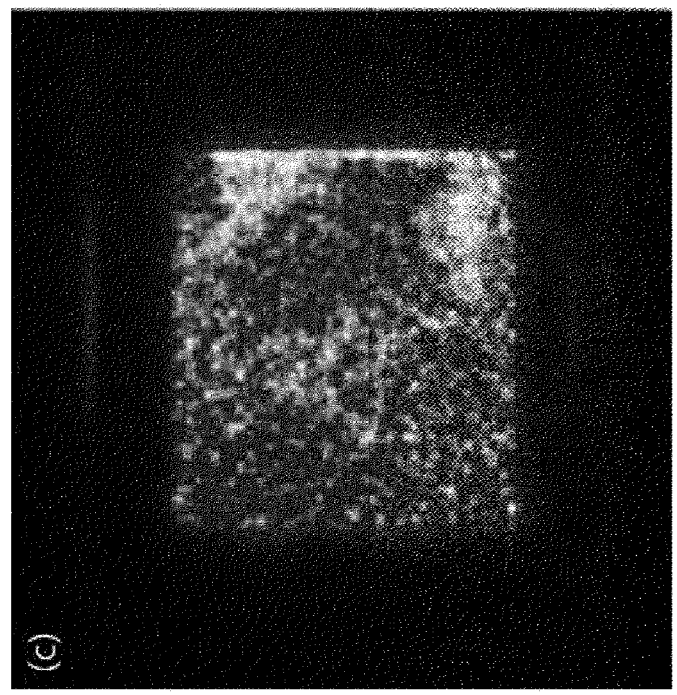
FIGS. 9A through 9C provide blue electroluminescent photographs of a self-assembled nano-scale LED electrode assembly according to yet another exemplary embodiment of the present disclosure.
Figure 9A:
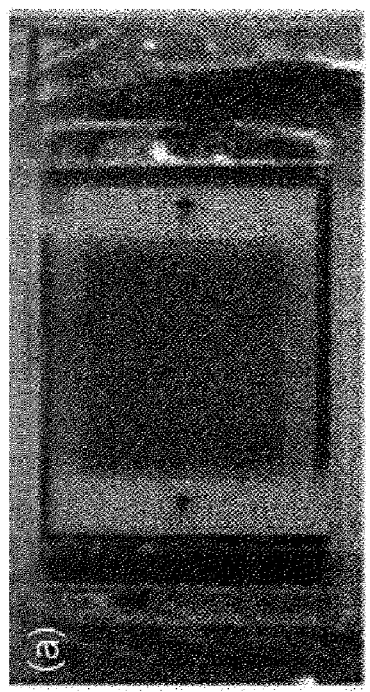
Figure 9B:
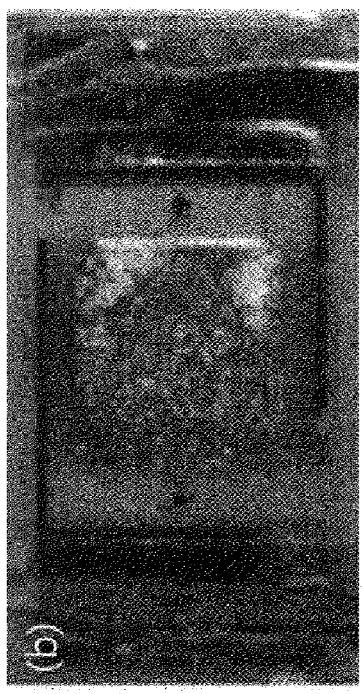

Specifically, FIGS. 9A through 9C provide blue electroluminescent photographs of a self-assembled nano-scale LED electrode assembly according to yet another exemplary embodiment of the present disclosure. FIG. 9A is a photograph photographed in a bright room before nano-scale LED devices emit light, FIG. 9B is a blue electroluminescent photograph of the nano-scale LED devices photographed in a bright room, and FIG. 9C is a blue electroluminescent photograph of the nano-scale LED devices photographed in a dark room. The solvent is methylethylketone having a dipole moment of 2.76 D, an electrical conductivity of 20 µS/m at 20° C., a boiling point of 79.6° C., a vapor pressure of 10.40 kPa at 20° C., and a viscosity of 0.426 cP at 20° C. and thus satisfies all the above-described conditions (a), (b), (c), and (d). As can be seen from FIGS. 9A through 9C, the methylethylketone is vaporized without damage to the electrode line and the nano-scale LED devices, and, thus, the nano-scale LED devices are self-aligned well, and the nano-scale LED devices are uniformly distributed and uniformly self-aligned on the electrode line.

Further, FIGS. 10A and 10B provide photographs of the self-assembled nano-scale LED electrode assembly of FIGS. 9A through 9C magnified with an optical microscope. Specifically, FIG. 10A is a 100 times magnified optical microscopic photograph of the nano-scale LED electrode assembly using methylethylketone as a solvent, and FIG. 10B is a 1500 times magnified optical microscopic photograph of the nano-scale LED electrode assembly using methylethylketone as a solvent. It can be seen from FIGS. 10A and 10B that nano-scale LED devices are not concentrated on any one portion of the electrode line but uniformly distributed and mounted, and aggregation of the devices is minimized.

Hereinafter, the step (2) according to the present disclosure will be described. In the step (2), the plurality of nano-scale LED devices 120 are self-aligned by applying power to the electrode line to connect ends of the nano-scale LED device 120 to the first mounting electrode 110 and the second mounting electrode 130, respectively, wherein the solvent satisfies conditions.

Even if the plurality of nano-scale LED devices 120 included in the nano-scale LED electrode assembly according to the present disclosure are self-aligned, they are connected to the first mounting electrode 110 and the second mounting electrode 130 as shown in FIG. 1C since power is applied to the first mounting electrode 110 and the second mounting electrode 130.

Herein, the power can remarkably improve alignment of nano-scale LED devices to be self-aligned and mounted on the electrodes and thus remarkably increase the number of nano-scale LED devices to be mounted on each unit area. In order to emit partially polarized light close to linearly polarized light in any one direction, the power may have a voltage of 0.1 $V_{pp}$ to 2000 $V_{pp}$ and a frequency of 10 Hz to 200 GHz and more preferably, may have a voltage of 0.1 $V_{pp}$ to 1000 $V_{pp}$ and a frequency of 10 Hz to 100 GHz. Further, the power may be variable power having a predetermined amplitude and period and may be a sine wave or pulse wave having a waveform except for the sine wave. For example, alternating current power may be applied, or direct current power of 0 V, 30 V, 0 V, 30 V, 0 V, and 30 V may be repeatedly applied to the first electrode and direct current power of 30 V, 0 V, 30 V, 0 V, 30 V, and 0 V which are inverted may be repeatedly applied to the second mounting electrode 1,000 times per second so as to generate variable power having the predetermined amplitude and period.

When the power has a voltage higher than 1000 $V_{pp}$, even if the power has a frequency in the above-described range, the number of nano-scale LED devices to be mounted is remarkably decreased and the high voltage strongly affects the electrodes. In severe cases, electrical short-circuit may occur in the electrode line. When the voltage is lower than 0.1 $V_{pp}$, even if the power has a frequency in the above-described range, fewer nano-scale LED devices may be mounted due to the low voltage as compared with the case where a voltage is too high. Also, alignment of the mounted nano-scale LED devices may remarkably deteriorate.

Further, when the frequency is lower than 10 Hz, even if the power has a voltage in the above-described range, the number of nano-scale LED devices to be mounted is remarkably decreased and the devices are aligned remarkably irregularly. When the frequency is higher than 1000 GHz, the nano-scale LED devices may not follow the changed polarity and thus may not be self-aligned well.

Specifically, as for the kind, a voltage and a frequency of power applied for self-alignment, the power may be simply variable power having an amplitude and period and may be a sine wave or pulse wave having a waveform except for the sine wave, and the power may have a voltage (amplitude) of 0.1 V to 1000 V and a frequency of 10 Hz to 100 GHz. In this case, alignment of nano-scale devices, i.e., a direction of the major axis between the devices, is substantially close to being parallel, and the nano-scale devices are mounted such that the direction of the major axis is close to being perpendicular to the mounting electrodes. Thus, an area of the electrode line required for a single nano-scale LED device to be mounted can be minimized, so that the number of nano-scale LED devices to be mounted on a limited mounting electrode region can be remarkably increased. Thus, the nano-scale LED electrode assembly can emit light having a remarkably high intensity.

Meanwhile, nano-scale LED devices to be self-aligned are inputted to the electrode line as being included in the solvent. In the nano-scale LED devices, charges are asymmetrically induced to the nano-scale LED devices due to induction of electric fields generated by a potential difference between two electrodes, both ends of the nano-scale LED device may be self-aligned between the two different electrodes facing each other. Then, the solvent may be vaporized and removed from the electrode assembly. Preferably, the vaporization of the solvent may occur at the same time as or after self-alignment of the nano-scale LED devices. The nano-scale LED device may be connected to the two different electrodes by applying power for 5 seconds to 120 seconds.

Meanwhile, the present disclosure includes a solvent suitable for manufacture of the above-described self-assembled nano-scale LED electrode assembly, and the solvent satisfies the following conditions (a) and (b).

(a) A dipole moment is 1.5 D or more.
(b) An electrical conductivity is 5 μS/m or more at 20° C.

The solvent for manufacture of the self-assembled nano-scale LED electrode assembly is the same as the solvent inputted in the step (1) of the above-described manufacturing method. Therefore, detailed descriptions thereof will be omitted. The solvent does not chemically or physically damage nano-scale LED devices, enables a plurality of nano-scale LED devices to be more easily self-aligned, remarkably increases the number of nano-scale LED devices to be mounted, induces electrostatic attraction when the nano-scale LED device moves on two different electrodes so as to improve mobility and self-alignment, and reduces a resistance of the nano-scale LED device to movement so as to further improve mobility of the nano-scale LED device, so that the solvent is very suitable for manufacture of a self-assembled nano-scale LED electrode assembly.

The present disclosure has been described above with reference to the accompanying drawings, but it will be understood that the above descriptions should be considered in a descriptive sense only and not for purposes of limitation to exemplary embodiments of the present disclosure. It will be understood by a person having ordinary skill in the art that various other modifications and applications may be made therein without departing from the spirit and scope of the exemplary embodiments. For example, respective components shown in detail in the exemplary embodiments may be executed while being modified. Also, it should be construed that differences related to the modification and application are included in the scope of the present disclosure as defined by the following claims.

Hereinafter, the present disclosure will be described with reference to the following Examples. Herein, the following examples are provided only for understanding of the present disclosure but not intended to limit the right scope of the present disclosure.

EXAMPLE 1

An electrode line as illustrated in FIG. 1A was manufactured on a base substrate formed of quartz and having a thickness of 800 μm. Here, in the electrode line, a first electrode had a width of 3 μm, a second electrode had a width of 3 μm, a distance between the first electrode and the adjacent second electrode was 2 μm, and each of the electrodes had a thickness of 0.2 μm. Also, each of the first and second electrodes was formed of titanium/gold, and in the electrode line, a region on which nano-scale LED devices had an area of $4.2 \times 10^7$ μm².

Then, methylethylketone was used as a solvent. A nano-scale LED device having a specification as shown in the following Table 1 and the structure as shown in FIG. 2 and coated to a thickness of about 0.02 μm with an insulation film on an external surface of an active layer of the nano-scale LED device was mixed by about 1.0 part by weight with respect to 100 parts by weight of methylethylketone so as to prepare a solution including the nano-scale LED devices.

Sine wave alternating current power having the minimum voltage of −30 V, the maximum voltage of 30 V and a frequency of 950 kHz was applied to the electrode line for 5 minutes and 9 μl of the prepared solution was dropped 9 times to the electrode line region on the base substrate, so that the nano-scale LED devices were self-aligned. Then, a heat treatment was performed at a pressure of $5.0 \times 10^{-1}$ torr at 810° C. for 2 minutes in a nitrogen atmosphere through rapid thermal annealing in order to improve contact between the nano-scale LED devices and the electrode line. Thereafter, light emission of the LED devices was checked.

TABLE 1

|  | Material | Length (μm) | Diameter (μm) |
| --- | --- | --- | --- |
| First electrode layer | Chromium | 0.03 | 0.5 |
| First conductive semiconductor layer | n-GaN | 2.14 | 0.5 |
| Active layer | InGaN | 0.1 | 0.5 |
| Second conductive semiconductor layer | p-GaN | 0.2 | 0.5 |
| Second electrode layer | Chromium | 0.03 | 0.5 |
| Insulation film | Aluminum oxide | — | 0.02 (thickness) |
| Nano-scale LED device | — | 2.5 | 0.52 |

EXAMPLES 2 TO 6 AND COMPARATIVE EXAMPLE

A nano-scale LED electrode assembly was manufactured in the same manner as Example 1 except that the kind of a solvent was changed as shown in the following Table 2.

EXPERIMENTAL EXAMPLE

With the nano-scale LED electrode assemblies manufactured according to Examples 1 to 6 and Comparative Example, the number of nano-scale LED devices emitting blue light was observed using an optical microscope. Then, the number was counted and the result thereof was as shown in the following Table 3.

TABLE 3

|  | Number of mounted nano-scale LED devices | Number of nano-scale LED devices emitting blue light |
| --- | --- | --- |
| Example 1 | 41532 | 2457 |
| Example 2 | 30156 | 1136 |
| Example 3 | 1055 | 0 |
| Example 4 | 9890 | 541 |
| Example 5 | 21981 | 238 |
| Example 6 | 6016 | 389 |
| Comparative Example | 5451 | 264 |

As can be seen from Table 3, in Example 1 using methylethylketone satisfying all the conditions for solvent of the present disclosure, the number of mounted nano-scale LED devices and the number of nan-scale LED devices emitting blue light were remarkably great as compared with Examples 2 to 6 and Comparative Example 6 each using a solvent which does not satisfy the conditions for solvent of the present disclosure. Thus, it can be seen that physical properties of methylethylketone satisfying all the conditions (a), (b), (c), (d), (e), and (f) and the viscosity of 0.3 cP to 1 cP at 20° according to the present disclosure are most suitable for manufacture of the nano-scale LED electrode assembly of the present disclosure.

Specifically, in Example 2 using isopropyl alcohol as a solvent, the nano-scale LED devices were self-aligned, so that the number of mounted nano-scale LED devices was great, but the nano-scale LED devices were excessively concentrated and aligned forming a white band along a droplet of a solution including the nano-scale LED devices and the solvent, which can be seen from FIGS. 7A through 7C. This means that when the nano-scale LED devices are self-aligned, the nano-scale LED devices are not spread well. Further, the electrode may be affected mainly by the

TABLE 2

|  |  | Example 1 | Example 2 | Example 3 | Example 4 | Example 5 | Example 6 | Comparative Example |
| --- | --- | --- | --- | --- | --- | --- | --- | --- |
| Solvent |  | Methylethyl ketone | Isopropyl alcohol | Distilled water | Hexamethyl phosphoric triamide | Acetonitrile | Diethyl ether | N-hexane |
| Dipole moment | Value(D) | 2.76 | 1.66 | 1.85 | 5.37 | 3.92 | 1.15 | 0.08 |
|  | Condition (a)/ Condition (e) | o/o | o/x | o/x | o/x | o/o | x/x | x/x |
| Electrical conductivity at 20° C. | Value (μS/m) | 20 | 6 | 5.50 | 1.25 | 700 | $4 \times 10^{-5}$ | $<10^{-6}$ |
|  | Condition (b)/Condition (f) | o/o | o/x | o/x | x/x | o/x | x/x | x/x |
| Boiling point (° C.)/ Whether or not condition (c) is satisfied |  | 79.6/o | 82.6/o | 100/x | 232.5/x | 82/o | 34.48/o | 68.8/o |
| Vapor pressure at 20° C. (kPa)/Condition (d) |  | 10.4/o | 4.399/o | 2.338/x | 0.004/x | 11.84/o | 58.66/o | 17.60/o |
| Viscosity at 20° C. (cP)/Viscosity condition |  | 0.426/o | 2.3703/x | 1.005/x | 3.25/x | 0.35/o | 0.2488/x | 0.3258/o | portion where the nano-scale LED devices are excessively self-aligned. In severe cases, electrical short-circuit may occur in the electrode line. It can be seen from Table 3 that the number of nano-scale LED devices emitting blue light was remarkably small in Example 2 as compared with Example 1. Thus, it can be seen that many electrical short-circuits occur in the electrode line.

Further, in Example 3 using distilled water as a solvent, when power is applied to the electrode, boiling occurs and the electrode burns out. It can be seen from FIGS. 6A and 6B that the nano-scale LED devices are concentrated and aggregated at only one portion. According to Table 3, there was no nano-scale LED device emitting blue light in Example 3. Thus, it can be seen that self-alignment of devices is not at all performed on the electrode.

Furthermore, in Example 4 using hexamethyl phosphoric triamide having a dipole moment of 5.37 D as a solvent, attraction between solvent molecules was increased, so that the solvent was not readily vaporized and thus continuously affected the nano-scale LED devices. According to Table 3, for the above-described reason, the number of nano-scale LED devices emitting blue light was small in Example 4 as compared with Example 1. Thus, it can be seen that the solvent affected the nano-scale LED devices.

Moreover, in Example 5 using acetonitrile having an electrical conductivity of 700 μS/m at 20° C. as a solvent, high current flowed through the solvent and electrical short-circuit occurred, so that the electrode line was damaged. According to Table 3, in Example 5, the number of mounted nano-scale LED devices was great but the number of nano-scale LED devices emitting blue light was remarkably small. Thus, it can be seen that electrical short-circuit occurred, so that the electrode line was damaged.

Also, in Example 6 where a viscosity was 0.2448 cP at 20° C., the solution was spread excessively wider than a desired region for mounting nano-scale LED devices. Thus, the amount of nano-scale LED devices to be used was increased. According to Table 3, Example 6 was not much different from Example 1 in the number of nano-scale LED devices emitting blue light as compared with the other Examples. However, the solution was spread excessively wide, so that brightness was not high (not illustrated). Thus, it can be seen that the nano-scale LED devices were spread excessively wide.

Further, in Comparative Example using n-hexane as a solvent, a dipole moment and an electrical conductivity were low. Thus, external power did not electrically affect the solvent, so that vaporization of the solvent was not induced. According to Table 3, there are nano-scale LED devices emitting light. This is because although vaporization of the solvent was not induced by the external power, some of the nano-scale LED devices were aligned while the solvent was naturally vaporized. Thus, it can be seen that although a small number of nano-scale LED devices was aligned on the electrode line, self-alignment of nano-scale LED devices by application of power was not performed.

What is claimed is:

1. A method for manufacturing a self-assembled nano-scale LED electrode assembly, comprising:
    (1) a step of inputting a plurality of nano-scale LED devices and a solvent to an electrode line including a base substrate, a first mounting electrode formed on the base substrate, and a second mounting electrode formed as being spaced from the first mounting electrode on the same plane as the first mounting electrode; and
    (2) a step of self-aligning the plurality of nano-scale LED devices by applying power to the electrode line to connect ends of a nano-scale LED device to the first mounting electrode and the second mounting electrode, respectively,
    wherein the solvent is vaporized at the same time as or after step (2), and
    wherein the solvent satisfies the following conditions (a) and (b):
        (a) a dipole moment is 1.5 D or more; and
        (b) an electrical conductivity is 5 μS/m or more at 20° C.

2. The method for manufacturing a self-assembled nano-scale LED electrode assembly according to claim 1, wherein the solvent further satisfies the following conditions (c) and (d):
    (c) a boiling point is 30° C. to 85° C.; and
    (d) a vapor pressure is 3 kPa to 100 kPa at 20° C.

3. The method for manufacturing a self-assembled nano-scale LED electrode assembly according to claim 1, wherein the solvent has a viscosity of 0.3 cP to 1 cP at 20° C.

4. The method for manufacturing a self-assembled nano-scale LED electrode assembly according to claim 1, wherein the conditions (a) and (b) for the solvent are the following conditions (e) and (f):
    (e) a dipole moment is 2.5 D to 5.0 D; and
    (f) an electrical conductivity is 10 μS/m to 500 μS/m at 20° C.

5. The method for manufacturing a self-assembled nano-scale LED electrode assembly according to claim 1, wherein the nano-scale LED device has an aspect ratio of 1.2 to 100.

6. The method for manufacturing a self-assembled nano-scale LED electrode assembly according to claim 1, wherein the nano-scale LED device has a length of 100 nm to 10 μm.

7. The method for manufacturing a self-assembled nano-scale LED electrode assembly according to claim 1, wherein the power applied in the step (2) has a voltage (amplitude) of 0.1 $V_{pp}$ to 1000 $V_{pp}$ and a frequency of 10 Hz to 100 GHz.

8. The method for manufacturing a self-assembled nano-scale LED electrode assembly according to claim 1, wherein the nano-scale LED device further includes a hydrophobic film coated on an external surface of an insulating film in order to suppress aggregation between the devices.

* * * * *